(12) United States Patent
Zhang

(10) Patent No.: US 12,417,936 B2
(45) Date of Patent: Sep. 16, 2025

(54) SEMICONDUCTOR ETCHING APPARATUS

(71) Applicant: CHANGXIN MEMORY TECHNOLOGIES, INC., Hefei (CN)

(72) Inventor: Faming Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 86 days.

(21) Appl. No.: 17/606,933

(22) PCT Filed: Jun. 17, 2021

(86) PCT No.: PCT/CN2021/100733
§ 371 (c)(1),
(2) Date: Dec. 8, 2022

(87) PCT Pub. No.: WO2022/252296
PCT Pub. Date: Dec. 8, 2022

(65) Prior Publication Data
US 2024/0021460 A1 Jan. 18, 2024

(30) Foreign Application Priority Data

Jun. 3, 2021 (CN) .......................... 202110620739.2

(51) Int. Cl.
*H01L 21/67* (2006.01)
*H01L 21/683* (2006.01)

(52) U.S. Cl.
CPC .... *H01L 21/6833* (2013.01); *H01L 21/67063* (2013.01); *H01L 21/67248* (2013.01)

(58) Field of Classification Search
CPC ........... H01L 21/6833; H01L 21/67063; H01L 21/67248; H01L 21/2015; H01L 21/3065; H01L 21/67; H01L 21/67109; H01L 21/68; H01L 21/68735; H01L 21/67069; H01J 37/32; H01J 37/32724; H01J 37/32871; H01J 2237/3343
USPC ........................ 118/728; 156/345.51, 345.52
See application file for complete search history.

(56) References Cited

U.S. PATENT DOCUMENTS

| 6,159,299 | A  | 12/2000 | Koai et al. |
| 6,475,336 | B1 | 11/2002 | Hubacek |
| 8,124,539 | B2 | 2/2012  | Endoh et al. |
| 9,947,559 | B2 | 4/2018  | Pal et al. |

(Continued)

FOREIGN PATENT DOCUMENTS

| CN | 101552182 A | 10/2009 |
| CN | 101552182 B | 11/2010 |

(Continued)

OTHER PUBLICATIONS

International Search Report in Application No. PCT/CN2021/100733, mailed on Mar. 9, 2022.

*Primary Examiner* — Rudy Zervigon
(74) *Attorney, Agent, or Firm* — SYNCODA LLC; Feng Ma

(57) ABSTRACT

A semiconductor etching apparatus includes: a backing ring, a supporting mechanism, an edge ring and a temperature control mechanism. The edge ring is arranged between the backing ring and the supporting mechanism. The temperature control mechanism includes a heating unit arranged below the edge ring. The temperature control mechanism further includes a temperature controller electrically connected with the heating unit.

15 Claims, 10 Drawing Sheets

(56) References Cited

U.S. PATENT DOCUMENTS

| | | | |
|---|---|---|---|
| 10,985,045 B2 | 4/2021 | Peng et al. | |
| 2003/0000459 A1 | 1/2003 | Park et al. | |
| 2005/0133164 A1 | 6/2005 | Fischer et al. | |
| 2008/0149598 A1* | 6/2008 | Hayashi | H01J 37/32642 |
| | | | 156/345.52 |
| 2010/0040768 A1* | 2/2010 | Dhindsa | H01L 21/67069 |
| | | | 427/248.1 |
| 2016/0198528 A1* | 7/2016 | Kitagawa | H01L 21/67109 |
| | | | 156/345.52 |
| 2017/0092472 A1* | 3/2017 | Koiwa | H01J 37/32798 |
| 2018/0182647 A1* | 6/2018 | Noh | H01L 21/67069 |
| 2018/0190501 A1* | 7/2018 | Ueda | H01J 37/32715 |
| 2018/0211822 A1* | 7/2018 | Gohira | H01J 37/3244 |
| 2018/0330925 A1* | 11/2018 | Sim | H01J 37/32724 |
| 2019/0051501 A1* | 2/2019 | Koizumi | H01L 21/67109 |
| 2019/0198298 A1* | 6/2019 | Hirose | H01J 37/32532 |
| 2020/0251313 A1* | 8/2020 | Rogers | H01L 21/6833 |
| 2021/0066049 A1* | 3/2021 | Hayashi | H01L 21/68757 |
| 2021/0280395 A1* | 9/2021 | Matsuura | H01L 21/68742 |
| 2021/0280396 A1* | 9/2021 | Matsuura | H01J 37/32715 |
| 2021/0305022 A1* | 9/2021 | Tsujimoto | H01J 37/32642 |
| 2022/0130651 A1* | 4/2022 | Amikura | H01L 21/67103 |
| 2022/0157575 A1* | 5/2022 | Kitamura | H01J 37/32642 |
| 2022/0310366 A1* | 9/2022 | Matsuura | H01L 21/68742 |
| 2023/0369026 A1* | 11/2023 | Kimball | H01J 37/32651 |
| 2024/0021460 A1* | 1/2024 | Zhang | H01L 21/68 |
| 2024/0194459 A1* | 6/2024 | Nagaseki | H01L 21/31 |
| 2025/0210330 A1* | 6/2025 | Matsumoto | H01J 37/32697 |

FOREIGN PATENT DOCUMENTS

| | | |
|---|---|---|
| CN | 105575863 A | 5/2016 |
| JP | 2007258500 A | 10/2007 |

\* cited by examiner

SEMICONDUCTOR ETCHING APPARATUS

CROSS-REFERENCE TO RELATED APPLICATIONS

This application is a national stage of International Application No. PCT/CN2021/100733 filed on Jun. 17, 2021, which claims priority to Chinese Patent Application No. 202110620739.2 filed on Jun. 3, 2021. The disclosures of these applications are hereby incorporated by reference in their entirety.

TECHNICAL FIELD

The present disclosure relates to, but is not limited to, a semiconductor etching apparatus.

BACKGROUND

At present, the electronic-static clamp (ESC) of most semiconductor etching machines adopts a 4-zone temperature control design. The semiconductor device to be etched covers the entire surface area of the ESC, and the edge of the semiconductor device extends to the edge ring. The etching effect at the edge of the semiconductor device is worse than the etching effect on the semiconductor device in the ESC temperature control zone. The etching process temperature of the semiconductor device is dominated by the ESC. Although a dedicated wafer measurement tool is configured to measure the temperature of the ESC in the chamber, the temperature of the edge ring cannot be controlled, that is, the temperature of the edge of the etched semiconductor device cannot be controlled.

Meanwhile, during the semiconductor etching process, as the radio frequency (RF) time increases, an increasingly deep trench will be formed on the surface of the edge ring by plasma etching. The deposited by-product particles in the trench are not easy to be removed, which will greatly shorten the service life of the edge ring, and will also cause contamination, thereby affecting the etching effect.

SUMMARY

An overview of the subject matter detailed in the present disclosure is arranged below, which is not intended to limit the protection scope of the claims.

The present disclosure provides a semiconductor etching apparatus. The present disclosure can control the temperature of an edge ring to improve the etching effect of a semiconductor device, and can remove particles deposited on the edge ring.

An embodiment of the present disclosure provides a semiconductor etching apparatus. The semiconductor etching apparatus includes:
  a backing ring;
  a supporting mechanism;
  an edge ring, wherein the edge ring is arranged between the backing ring and the supporting mechanism; and
  a temperature control mechanism, wherein the temperature control mechanism includes a heating unit arranged below the edge ring;
  the temperature control mechanism further includes a temperature controller electrically connected with the heating unit.

In some embodiments, the heating unit may be arranged directly below the edge ring.

In some embodiments, the heating unit may include:
  a ring-shaped heating unit; or,
  a plurality of heating units arranged at intervals.

In some embodiments, the semiconductor etching apparatus may further include a moving mechanism; the moving mechanism may be located directly below the edge ring, and may be used to drive the edge ring to move between a first position and a second position relative to the supporting mechanism under a preset condition;
  when the edge ring is in the first position, a first surface of the edge ring may be adapted to a surface of the backing ring and/or a surface of the supporting mechanism; when the edge ring is in the second position, the first surface of the edge ring may be lower than the surface of the backing ring and/or the surface of the supporting mechanism.

In some embodiments, the heating unit may be arranged on a top surface of the moving mechanism.

In some embodiments, the moving mechanism may include at least two lifting devices; the at least two lifting devices may be distributed at equal intervals directly below the edge ring.

In some embodiments, a chamber may be arranged among the backing ring, the supporting mechanism and the edge ring;
  when the edge ring is in the second position, the edge ring may be located in the chamber.

In some embodiments, the supporting mechanism may include a supporting unit;
  the semiconductor etching apparatus may further include a cleaning mechanism; a gas outlet of the cleaning mechanism may be arranged on a peripheral wall of the supporting unit;
  when the edge ring is in the second position, the first surface of the edge ring may be adapted to the position of the gas outlet of the cleaning mechanism.

In some embodiments, when the edge ring is in the second position, the first surface of the edge ring may be located below the gas outlet of the cleaning mechanism.

In some embodiments, the gas outlet of the cleaning mechanism may be configured in one of the following forms:
  a ring-shaped gas outlet, arranged along the peripheral wall of the supporting unit; and
  a plurality of hole-shaped gas outlets, arranged along the peripheral wall of the supporting unit.

In some embodiments, the cleaning mechanism may further include a first driving device; the first driving device may communicate with the gas outlet through a gas supply passage.

In some embodiments, the semiconductor etching apparatus may further include a suction mechanism; a suction port of the suction mechanism may be arranged on an inner peripheral wall of the backing ring.

In some embodiments, when the edge ring is in the second position, the suction port of the suction mechanism may be located below the first surface of the edge ring.

In some embodiments, the suction port of the suction mechanism may be configured in one of the following forms:
  a ring-shaped suction port, arranged along the inner peripheral wall of the backing ring; and
  a plurality of suction ports, arranged along the inner peripheral wall of the backing ring.

In some embodiments, the suction mechanism may further include a second driving device; the second driving device may communicate with the suction port through a suction passage.

In some embodiments, the temperature controller may be arranged in the chamber, and an insulating mechanism may be sleeved on an outer periphery of the temperature controller.

In some embodiments, the supporting mechanism may further include an electronic-static clamp (ESC); the ESC may be arranged on the supporting unit.

The semiconductor etching apparatus of the embodiments of the present disclosure adjusts the temperature of the edge ring through the temperature control mechanism to realize the control of the temperature of the edge of the etched semiconductor device, thereby improving the etching effect of the semiconductor device, improving the etching uniformity and improving the product yield.

It should be understood that the above general description and the following detailed description are only exemplary, and should not be construed as a limitation to the present disclosure.

BRIEF DESCRIPTION OF THE DRAWINGS

The drawings incorporated into the specification and constituting a part of the specification illustrate the embodiments of the present disclosure, and are used together with the description to explain the principles of the present disclosure. In these drawings, similar reference numerals are used to represent similar elements. The drawings in the following description are a part rather than all of the embodiments of the present disclosure. Persons of ordinary skill in the art may obtain other drawings based on these drawings without creative efforts.

DETAILED DESCRIPTION

In order to make the objectives, technical solutions and advantages of the embodiments of the present disclosure clearer, the technical solutions in the embodiments of the present disclosure are clearly and completely described below in conjunction with the accompanying drawings in the embodiments of the present disclosure. Obviously, the described embodiments are part, rather than all of the embodiments of the present disclosure. All other embodiments obtained by a person of ordinary skill in the art based on the embodiments of the present disclosure without creative efforts should fall within the protection scope of the present disclosure. It should be noted that the embodiments in the present disclosure and features in the embodiments may be combined with each other in a non-conflicting manner.

The present disclosure provides a semiconductor etching apparatus. During the etching process of a semiconductor device, the temperature of an edge ring is adjusted by a temperature control mechanism to realize the control of the edge temperature of the semiconductor device, thereby improving the etching effect of the edge of the semiconductor device, improving the etching uniformity of the semiconductor device and improving the product yield. Meanwhile, a moving mechanism cooperates with a cleaning mechanism to remove particles deposited on the edge ring, so as to avoid contamination caused by the deposited particles, thereby further ensuring the etching effect of the semiconductor device.

The present disclosure proposes a semiconductor etching apparatus, which is described below with reference to the accompanying drawings and specific implementations.

Figure 1:
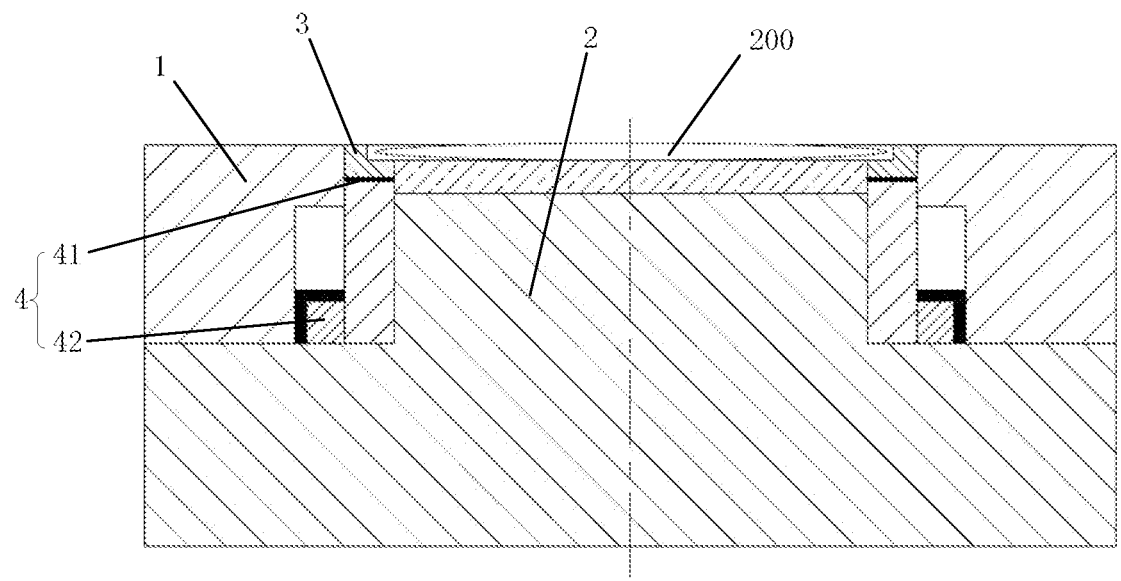
FIG. 1 is a longitudinal sectional view of a semiconductor etching apparatus according to an exemplary embodiment of the present disclosure.

FIG. 1 is a schematic structural diagram of a semiconductor etching apparatus according to an exemplary embodiment of the present disclosure. Referring to FIG. 1, the semiconductor etching apparatus includes a backing ring 1, a supporting mechanism 2, an edge ring 3 and a temperature control mechanism 4. The supporting mechanism 2 is configured to support a semiconductor device 200 to be etched. The backing ring 1 is sleeved on the supporting mechanism 2. The edge ring 3 is arranged between the backing ring 1 and the supporting mechanism 2. The temperature control mechanism 4 is configured to control the temperature of the edge ring 3. In a practical application, the semiconductor device 200 completely covers a top surface of the supporting mechanism 2, and an edge of the semiconductor device 200 is located above the edge ring 3. The temperature control mechanism 4 achieves the purpose of controlling the edge temperature of the semiconductor device 200 by controlling the temperature of the edge ring 3, thereby ensuring the etching effect of the semiconductor device 200 and improving the product yield.

The temperature control mechanism 4 includes a heating unit 41. The heating unit 41 is arranged below the edge ring 3 to heat the edge ring 3. The temperature control mechanism 4 further includes a temperature controller 42. The temperature controller 42 is electrically connected with the heating unit 41 to control the heating temperature of the heating unit 41, so as to control the temperature of the edge ring 3, and further control the edge temperature of the semiconductor device 200 etched by the semiconductor etching apparatus.

Figure 2:
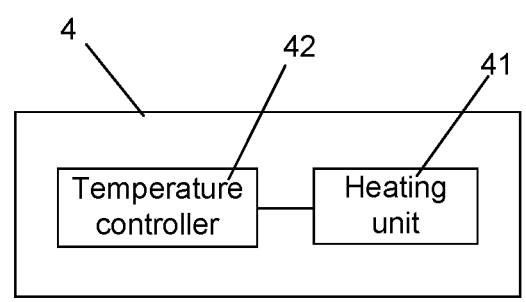
FIG. 2 is a structural block diagram of a temperature control mechanism according to an exemplary embodiment of the present disclosure.

The edge ring 3 has a ring-shaped structure, which ensures the uniformity of controlling the edge temperature of the semiconductor device 200. In some embodiments, one heating unit 41 is arranged below the edge ring 3. FIG. 2 shows a structural block diagram of the temperature control mechanism 4 according to an exemplary embodiment. In this embodiment, the temperature controller 42 effectively controls the temperature change of the edge ring 3 by controlling the temperature of the heating unit 41. In addition, it also ensures the uniform temperature distribution of the edge ring 3 in a circumferential direction, thereby controlling the edge temperature change of the semiconductor device 200 and ensuring the uniform edge temperature change of the semiconductor device 200.

Figure 3:
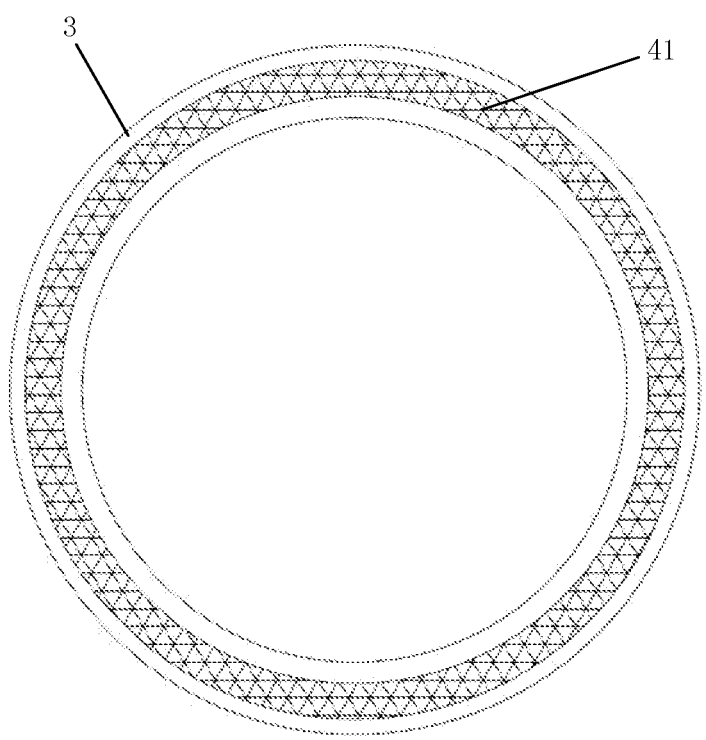
FIG. 3 is a bottom view showing a position of a heating unit below an edge ring according to an exemplary embodiment of the present disclosure.

FIG. 3 shows a bottom view of the position of the heating unit 41 below the edge ring 3 according to an exemplary embodiment. In this embodiment, the heating unit 41 has a closed ring-shaped structure. The width of the heating unit 41 is adapted to that of the edge ring 3. For example, the width of the heating unit 41 may be equal to that of the edge ring 3 or slightly smaller than that of the edge ring 3.

Figure 4:
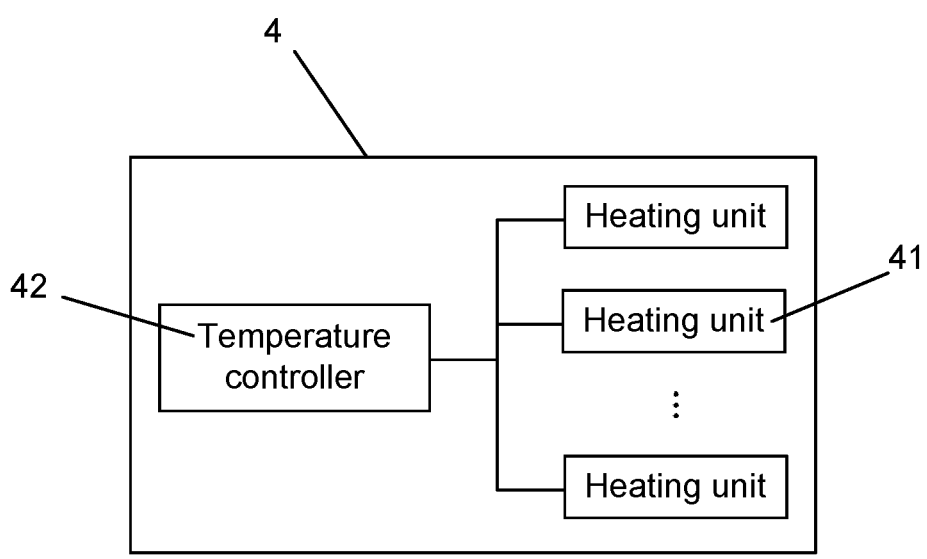
FIG. 4 is a structural block diagram of a temperature control mechanism according to another exemplary embodiment of the present disclosure.

In some other embodiments, a plurality heating units 41 are arranged at intervals below the edge ring 3. FIG. 4 shows a structural block diagram of the temperature control mechanism 4 according to an exemplary embodiment. In this embodiment, one temperature controller 42 controls the temperature changes of a plurality of heating units 41 at the same time, so as to control the temperature of the edge ring 3 to change uniformly. In other embodiments, each heating unit 41 of the plurality of heating units 41 is arranged with a temperature controller 42. Each temperature controller 42 controls the temperature change of the corresponding heating unit 41 respectively. Meanwhile, by adjusting the control parameters of the plurality of temperature controllers 42 at the same time, the temperature changes of the plurality of heating units 41 are controlled at the same time, thereby realizing the uniform temperature change of the edge ring 3.

For example, three or more (for example, 6, 8 or 12) heating units 41 are arranged at equal intervals below the edge ring 3 along the circumferential direction of the edge ring 3. In this case, the heating unit 41 may have any structure, such as an arc structure, a circular structure or a rectangular structure that is feasible. For example, two or more ring-shaped heating units 41 may be distributed at intervals along a radial direction of the edge ring 3. In this case, the heating units 41 may have a closed ring-shaped structure, and heating units 41 with different diameters may be combined for use.

Figure 5:
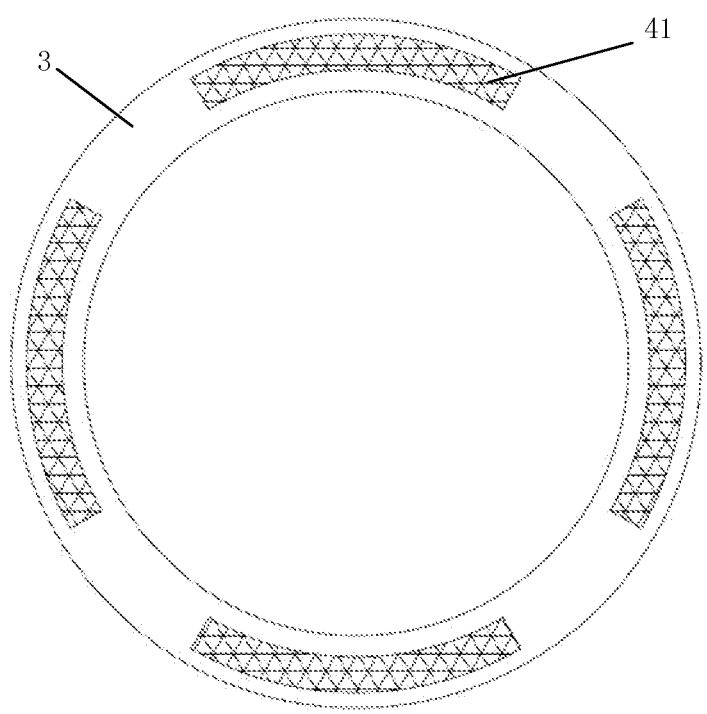
FIGS. 5 to 7 are bottom views showing a position of a heating unit below an edge ring according to an exemplary embodiment of the present disclosure.
Figure 6:
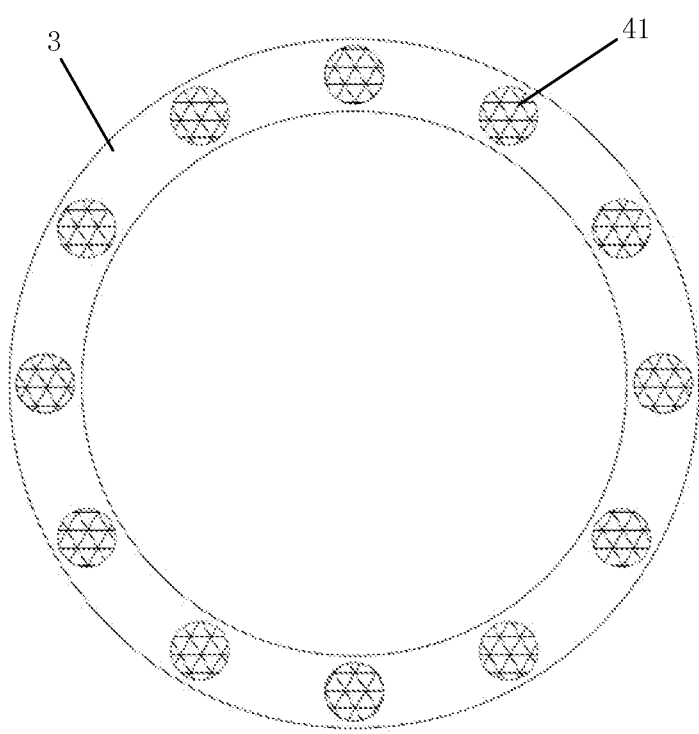
Figure 7:
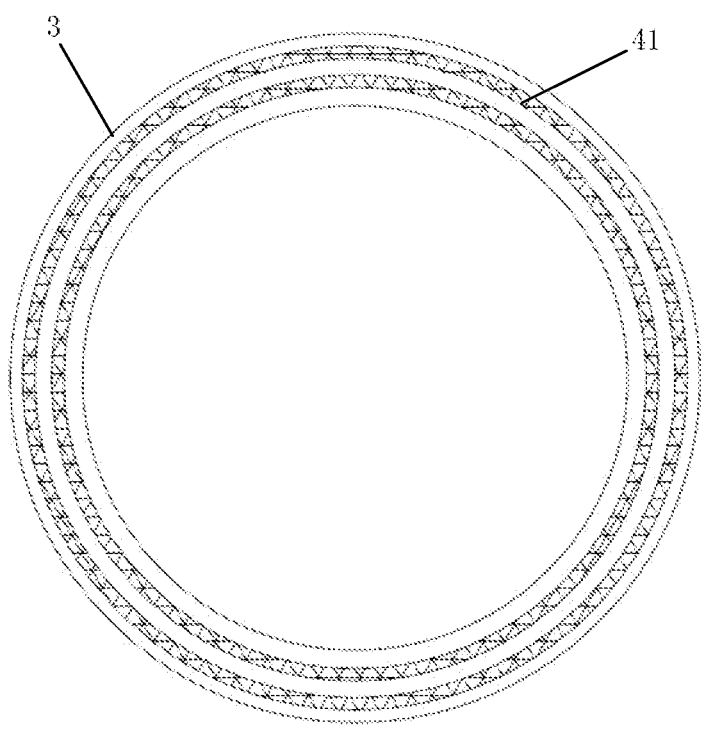

FIGS. 5 to 7 are bottom views showing the position of the heating unit 41 below the edge ring 3 according to an exemplary embodiment of the present disclosure. In the embodiments shown in FIGS. 5 and 6, a plurality of heating units 41 are distributed at equal intervals along the circumferential direction of the edge ring 3. In the embodiment shown in FIG. 7, two ring-shaped heating units 41 with different diameters are distributed at intervals below the edge ring 3 along the radial direction of the edge ring 3.

In some exemplary embodiments, the heating units 41 are arranged directly below the edge ring 3 so as to improve the temperature control efficiency of the edge ring 3 and control the temperature of the edge ring 3 more uniformly.

Figure 8:
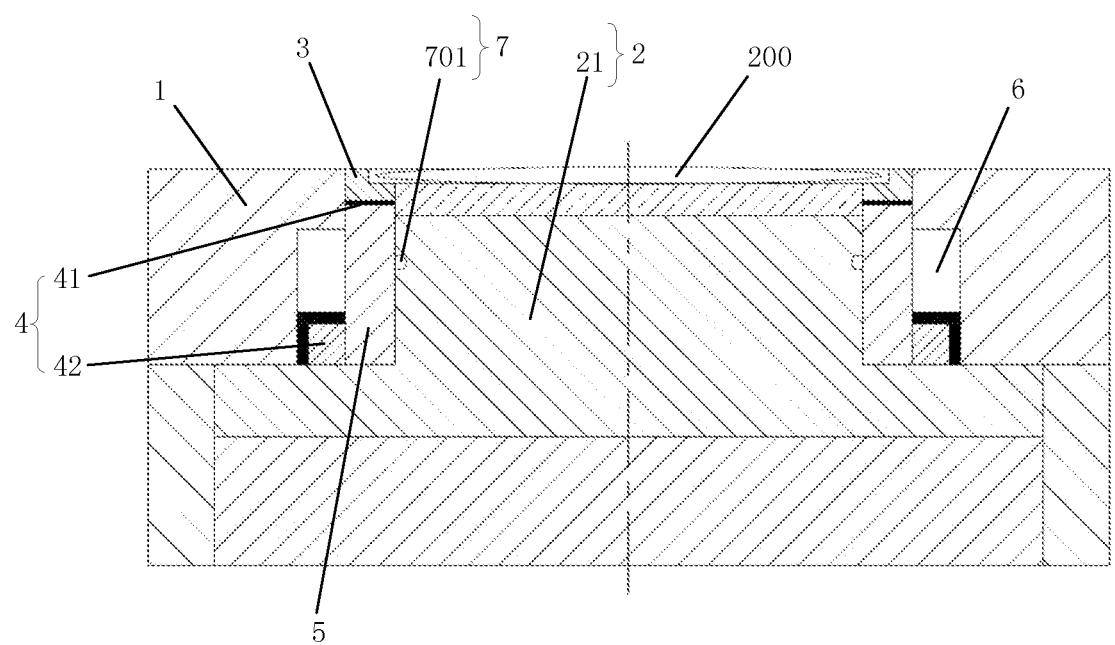
FIG. 8 is a longitudinal sectional view of a semiconductor etching apparatus according to an exemplary embodiment of the present disclosure.

FIG. 8 is a longitudinal sectional view of the semiconductor etching apparatus according to an exemplary embodiment of the present disclosure. Referring to FIG. 8, the semiconductor etching apparatus further includes a moving mechanism 5. The moving mechanism 5 is located directly below the edge ring 3, and is configured to drive the edge ring 3 to move between a first position and a second position relative to the supporting mechanism 2 under a preset condition, so as to facilitate a further operation, for example, to clean the edge ring 3.

Figure 9:
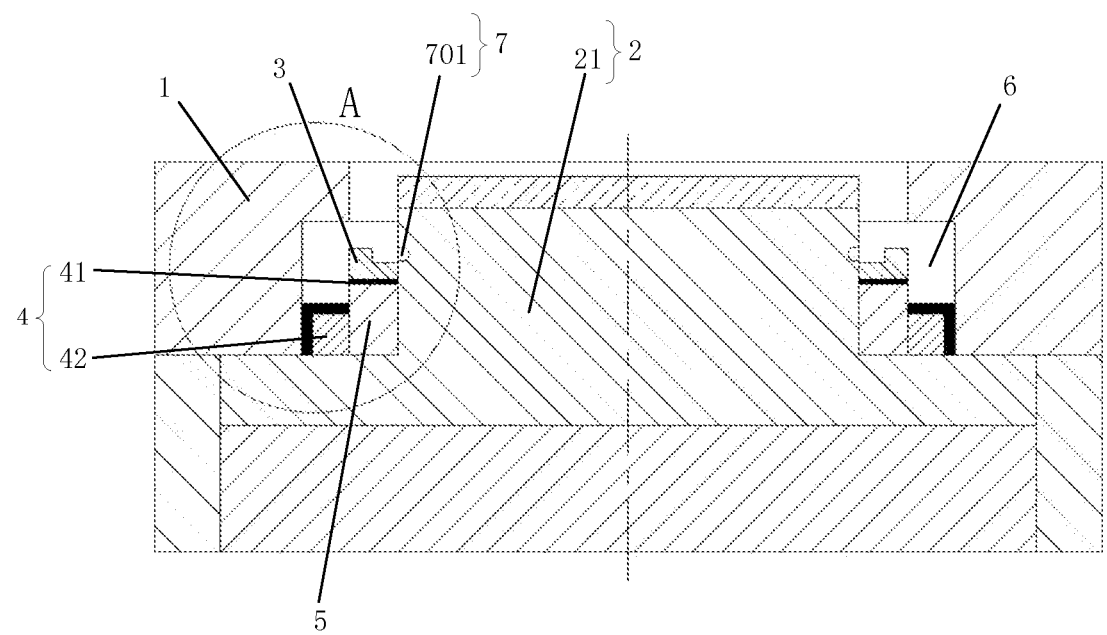
FIG. 9 is a schematic diagram showing the edge ring in a second position according to an exemplary embodiment of the present disclosure.

Exemplarily, as shown in FIG. 8, when the edge ring 3 is in the first position, a first surface of the edge ring 3 is adapted to a surface of the backing ring 1 and/or the surface of the supporting mechanism 2. As shown in FIG. 9, when the edge ring 3 is in the second position, the first surface of the edge ring 3 is lower than the surface of the backing ring 1 and/or the surface of the supporting mechanism 2.

In some embodiments of the semiconductor etching apparatus, as shown in FIG. 8, one part of the edge ring 3 is located below the semiconductor device 200, and the other part thereof is located at the periphery of the semiconductor device 200; the surface of the backing ring 1 is higher than that of the supporting mechanism 2. In an exemplary embodiment, in the first position, when the surface of the part of the edge ring 3 below the semiconductor device 200 is taken as the first surface, the first surface of the edge ring 3 is lower than an upper surface of the backing ring 1 by a predetermined height and is flush with an upper surface of the supporting mechanism 2. When the top surface of the edge ring 3 is taken as the first surface, in the first position, the first surface of the edge ring 3 is flush with the upper surface of the backing ring 1 and is higher than the upper surface of the supporting mechanism 2 by a predetermined height. When the edge ring 3 is in the second position, the first surface is lower than the upper surface of the supporting mechanism 2 and also lower than the upper surface of the backing ring 1, no matter which surface of the edge ring 3 is taken as the first surface.

In some optional embodiments, the moving mechanism 5 includes at least two lifting devices. The at least two lifting devices are distributed at intervals below the edge ring 3 and operate synchronously. For example, three or four lifting devices are arranged at equal intervals directly below the edge ring 3, along the circumferential direction of the edge ring 3. The three or four lifting devices operate synchronously, so as to drive the edge ring 3 to move smoothly between the first position and the second position. Exemplarily, the lifting device may use a telescopic mechanism such as an electric telescopic rod or a hydraulic telescopic rod.

The moving mechanism 5 is configured to move the edge ring 3 between the first position and the second position, and the heating unit 41 is configured to change the temperature of the edge ring 3. Therefore, the heating unit 41 is located between the edge ring 3 and the moving mechanism 5, and the heating unit 41 moves with the movement of the edge ring 3. Exemplarily, the heating unit 41 is clamped between a bottom surface of the edge ring 3 and a top surface of the moving mechanism 5. In some embodiments, the heating unit 41 is fixedly connected with the bottom of the edge ring 3, for example, embedded in the bottom surface of the edge ring 3. In other embodiments, the heating unit 41 is arranged on the top surface of the moving mechanism 5. For example, the heating unit 41 may be fixedly connected with the top surface of the moving mechanism or embedded in the top surface of the moving mechanism 5.

In some embodiments, a chamber 6 is arranged among the backing ring 1, the supporting mechanism 2 and the edge ring 3. When the edge ring 3 is in the second position, the edge ring 3 is located in the chamber 6 to facilitate a further operation on the edge ring 3.

In some embodiments of the semiconductor etching apparatus, the supporting mechanism 2 includes a supporting unit 21. The semiconductor etching apparatus further includes a cleaning mechanism 7. A gas outlet 701 of the cleaning mechanism 7 is arranged on a peripheral wall of the supporting unit 21, and a gas ejected through the gas outlet 701 is directed into the chamber 6. The moving mechanism 5 is located outside a radial peripheral wall of the supporting unit 21, and the inner diameter of the edge ring 3 is greater than or equal to the diameter of the supporting unit 21 wherein the gas outlet 701 is arranged. Driven by the moving mechanism 5, the edge ring 3 moves relative to an outer wall of the supporting unit 21. When the edge ring 3 is in the second position, the first surface of the edge ring 3 is adapted to the position of the gas outlet 701 of the cleaning mechanism 7. In this way, the gas ejected through the gas outlet 701 removes particles deposited on the surface of the edge ring 3, thereby preventing the deposited particles on the surface of the edge ring 3 from causing contamination during the etching process. The first surface of the edge ring 3 is adapted to the position of the gas outlet 701 of the cleaning mechanism 7. That is, the first surface of the edge ring 3 is in a blowing range of the gas ejected through the gas outlet 701. For example, the first surface of the edge ring 3 is located within a height range corresponding to the gas outlet 701, or is flush with or lower than a bottom end of the gas outlet 701.

Figure 10:
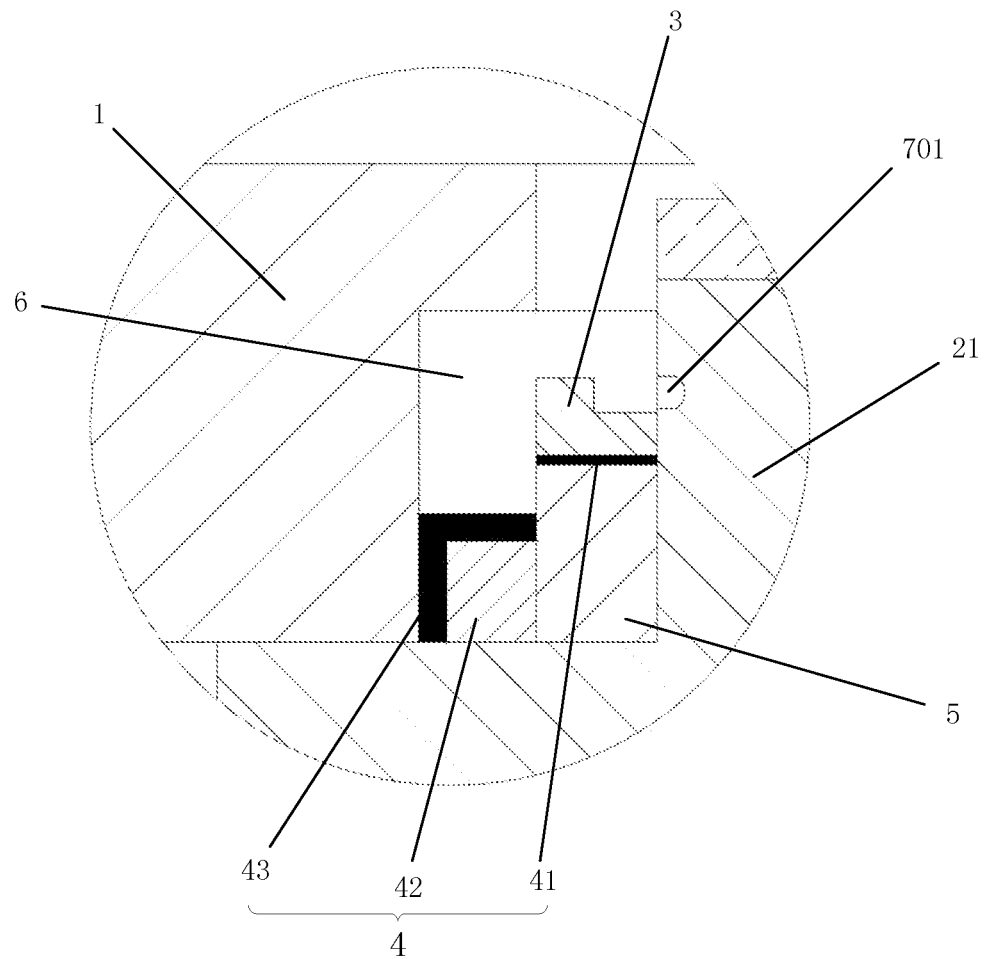
FIG. 10 is a detail of A in FIG. 9.

FIG. 9 is a longitudinal sectional view of the semiconductor etching apparatus when the edge ring 3 is located at the second position according to an exemplary embodiment, and FIG. 10 is a detail of A in FIG. 9. As shown in FIGS. 9 and 10, in this embodiment, when the edge ring 3 is in the second position, the first surface of the edge ring 3 is located below the gas outlet 701 of the cleaning mechanism 7. It should be noted that, in this case, the first surface of the edge ring 3 is not located too much below the gas outlet 701, but slightly lower than a bottom edge of the gas outlet 701, still within the blowing range of the gas ejected through the gas outlet 701.

In some optional embodiments, the gas outlet 701 of the cleaning mechanism 7 is configured in one of the following forms:
    a ring-shaped gas outlet, arranged along the peripheral wall of the supporting unit 21; and
    a plurality of hole-shaped gas outlets, arranged along the peripheral wall of the supporting unit 21, for example, 8, 10 or 12 gas outlets arranged at equal intervals along the circumferential direction on the same height of the peripheral wall of the supporting unit 21.

Exemplarily, the gas ejected through the gas outlet 701 may be compressed air. In another exemplary embodiment, the cleaning mechanism 7 may use an inert gas. That is, the gas ejected through the gas outlet 701 may be an inert gas, such as nitrogen, which can prevent moisture, oxygen and other components in the air from adversely affecting the parts of the semiconductor etching apparatus.

Figure 11:
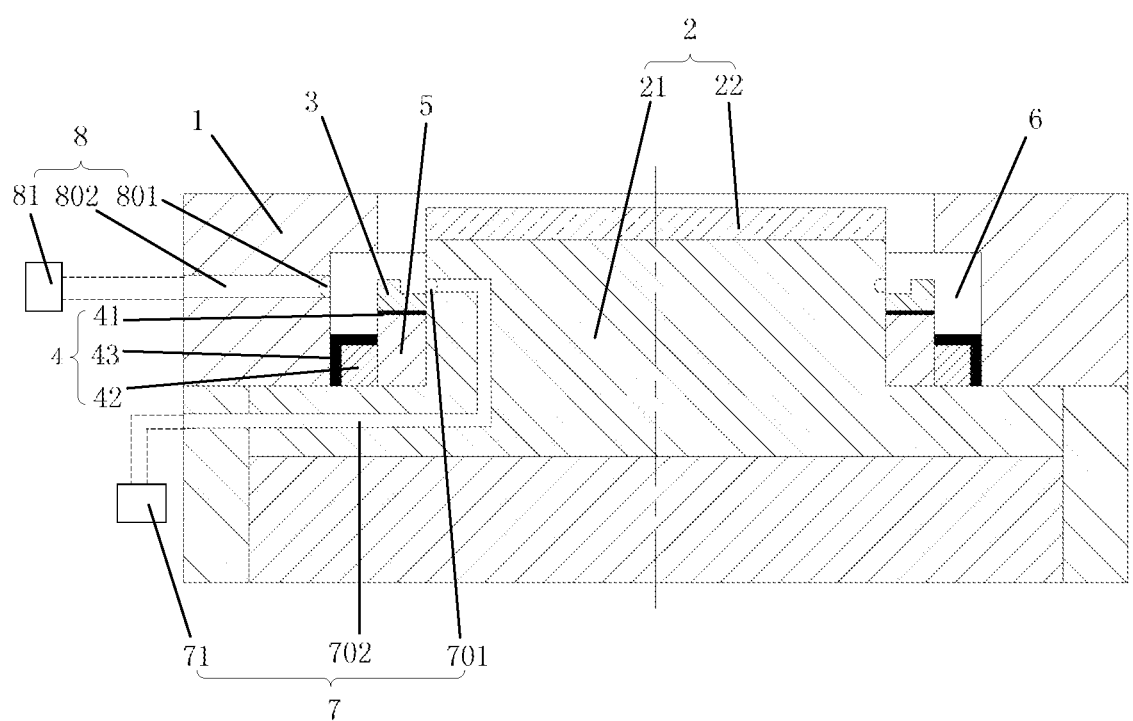
FIG. 11 is a longitudinal sectional view of a semiconductor etching apparatus according to an exemplary embodiment of the present disclosure.

FIG. 11 is a longitudinal sectional view of the semiconductor etching apparatus according to an exemplary embodiment of the present disclosure. Referring to FIG. 11, in some embodiments, the cleaning mechanism 7 further includes a first driving device 71. The first driving device 71 communicates with the gas outlet 701 through a gas supply passage 702.

After the etching of the semiconductor device 200 is completed, the moving mechanism 5 is activated to drive the edge ring 3 to move to the second position. Then the first driving device 71 is activated, and a gas (for example, $N_2$) is supplied through a gas supply tube 702. The gas is sprayed to the surface of the edge ring 3 through the gas outlet 701 to blow particles deposited on the surface of the edge ring 3, for example, to blow the particles deposited on the surface of the edge ring 3 into the chamber 6.

It should be pointed out that in the semiconductor etching apparatus of the present disclosure, the cleaning mechanism 7 cleans the edge ring 3 when the semiconductor device 200 is not placed on the supporting mechanism 2. That is, the cleaning mechanism 7 cleans when the semiconductor device is not etched or when the etching is completed, so as to prevent contamination of the semiconductor device 200 during the cleaning process.

In some embodiments, the semiconductor etching apparatus of the present disclosure further includes a suction mechanism 8. The suction mechanism is configured to suck deposited particles removed from the surface of the edge ring 3, for example, those blown into the chamber 6 by the cleaning mechanism 7. The suction mechanism may also directly suck particles blown to suspend by the cleaning mechanism 7 during the cleaning process of the cleaning mechanism 7. Exemplarily, a suction port 801 of the suction mechanism 8 is arranged on an inner peripheral wall of the backing ring 1 or on the top of the chamber 6.

In some embodiments, when the edge ring 3 is in the second position, the suction port 801 of the suction mechanism 8 is located below the first surface of the edge ring 3, so as to facilitate suction of particles deposited on the bottom of the chamber 6. Meanwhile, the position of the suction port 801 of the suction mechanism 8 may be lower than that of the gas outlet 701 of the cleaning mechanism 7.

Exemplarily, the suction port 801 of the suction mechanism 8 is configured in one of the following forms:
    a ring-shaped suction port 801, arranged along the inner peripheral wall of the backing ring 1; and
    a plurality of suction ports 801, arranged along the inner peripheral wall of the backing ring 1, for example, 12 or 18 suction ports 801 arranged at equal intervals on the inner peripheral wall of the backing ring 1.

In some embodiments, the suction mechanism 8 further includes a second driving device 81. The second driving device 81 communicates with the suction port 801 through a suction passage 802. The second driving device 81 sucks the gas in the chamber 6 through the suction passage 802 and the suction port 801. The particles deposited or suspended in the chamber 6 are driven by the airflow into the suction passage 802 and are sucked away. In addition, after the gas in the chamber 6 is sucked away, the gas pressure sharply drops to a negative pressure, which further enables the suction of the remaining particles in the chamber 6.

In some embodiments, the temperature controller 42 is arranged in chamber 6, and an insulating mechanism 43 is sleeved on an outer periphery of the temperature controller 42. The insulating mechanism 43 covers the temperature controller 42, and effectively prevents particles deposited on the surface of the edge ring 3 from being blown onto the temperature controller 42, thereby ensuring the normal operation of the temperature controller 42.

It should be pointed out that in the semiconductor etching apparatus of the present disclosure, the supporting mechanism 2 further includes an electronic-static chuck (ESC) 22. The ESC 22 is arranged on the supporting unit 21, and used to fix the semiconductor device 200 to be etched. When the edge ring 3 is in the first position, the edge ring 3 is sleeved on the ESC 22, and the first surface of the edge ring 3 is matched with an upper surface of the ESC 22.

Those skilled in the art may easily think of other implementation solutions of the present disclosure after considering the specification and practicing the content disclosed herein. The present application is intended to cover any variations, uses, or adaptive changes of the present disclosure. These variations, uses, or adaptive changes follow the general principles of the present disclosure and include common knowledge or conventional technical means in the technical field that are not disclosed by the present disclosure. The specification and embodiments are merely considered as illustrative, and the real scope and spirit of the present disclosure are pointed out by the appended claims.

It should be noted that, the present disclosure is not limited to the precise structures that have been described above and shown in the accompanying drawings, and can be modified and changed in many forms without departing from the scope of the present disclosure. The scope of the present disclosure is defined by the appended claims.

INDUSTRIAL APPLICABILITY

In the semiconductor etching apparatus arranged by the present disclosure, the temperature of the edge ring is adjusted by the temperature control mechanism to realize the control of the edge temperature of the semiconductor device, thereby improving the etching effect of the edge of the semiconductor device, improving the etching uniformity of the semiconductor device and improving the product yield. Meanwhile, the moving mechanism cooperates with the cleaning mechanism to remove particles deposited on the edge ring, so as to avoid contamination caused by the deposited particles, thereby further ensuring the etching effect of the semiconductor device.

What is claimed is:

1. A semiconductor etching apparatus, comprising: a backing ring; a supporting mechanism; an edge ring, arranged between the backing ring and the supporting mechanism; a temperature control mechanism, comprising a heating unit arranged below the edge ring; wherein, the temperature control mechanism further comprises a temperature controller electrically connected with the heating unit; and a moving mechanism; wherein the moving mechanism is located directly below the edge ring, and is configured to drive the edge ring to move between a first position and a second position relative to the supporting mechanism under a preset condition; when the edge ring is in the first position, a first surface of the edge ring is coplanar to a top surface of the backing ring and/or a surface of the supporting mechanism; when the edge ring is in the second position, the first surface of the edge ring is lower than the top surface of the backing ring and/or the surface of the supporting mechanism.

2. The semiconductor etching apparatus according to claim 1, wherein the heating unit is arranged directly below the edge ring.

3. The semiconductor etching apparatus according to claim 1, wherein the heating unit is configured in a form of: a plurality of heating units arranged at intervals.

4. The semiconductor etching apparatus according to claim 1, wherein the heating unit is arranged on a top surface of the moving mechanism.

5. The semiconductor etching apparatus according to claim 1, wherein a chamber is arranged within the backing ring, the supporting mechanism and the edge ring; when the edge ring is in the second position, the edge ring is located in the chamber.

6. The semiconductor etching apparatus according to claim 5, wherein the supporting mechanism comprises a supporting unit;
the semiconductor etching apparatus further comprises a cleaning mechanism; a gas outlet of the cleaning mechanism is arranged on a peripheral wall of the supporting unit;
when the edge ring is in the second position, the first surface of the edge ring is adapted to the position of the gas outlet of the cleaning mechanism.

7. The semiconductor etching apparatus according to claim 6, wherein when the edge ring is in the second position, the first surface of the edge ring is located below the gas outlet of the cleaning mechanism.

8. The semiconductor etching apparatus according to claim 7, wherein the gas outlet of the cleaning mechanism is configured in
a form of a ring-shaped gas outlet, arranged along the peripheral wall of the supporting unit.

9. The semiconductor etching apparatus according to claim 8, wherein the cleaning mechanism further comprises a first driving device; the first driving device communicates with the gas outlet by a gas supply passage.

10. The semiconductor etching apparatus according to claim 6, wherein the semiconductor etching apparatus further comprises a suction mechanism; a suction port of the suction mechanism is arranged on an inner peripheral wall of the backing ring.

11. The semiconductor etching apparatus according to claim 10, wherein when the edge ring is in the second position, the suction port of the suction mechanism is located below the first surface of the edge ring.

12. The semiconductor etching apparatus according to claim 11, wherein the suction port of the suction mechanism is configured in
a form of a ring-shaped suction port, arranged along the inner peripheral wall of the backing ring.

13. The semiconductor etching apparatus according to claim 11, wherein the suction mechanism further comprises a second driving device; the second driving device communicates with the suction port of the suction mechanism by a suction passage.

14. The semiconductor etching apparatus according to claim 5, wherein the temperature controller is arranged in the chamber, and an insulating mechanism is sleeved on an outer periphery of the temperature controller.

15. The semiconductor etching apparatus according to claim 6, wherein the supporting mechanism further comprises an electronic-static clamp; the electronic-static clamp is arranged on the supporting unit.

\* \* \* \* \*